United States Patent
Li

(10) Patent No.: US 9,941,490 B1
(45) Date of Patent: Apr. 10, 2018

(54) MANUFACTURE METHOD OF QUANTUM DOT LIGHT-EMITTING DIODE DISPLAY AND QUANTUM DOT LIGHT-EMITTING DIODE DISPLAY

(71) Applicant: Shenzhen China Star Optoelectronics Technology Co., Ltd., Shenzhen (CN)

(72) Inventor: Dongze Li, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 180 days.

(21) Appl. No.: 15/106,315

(22) PCT Filed: May 23, 2016

(86) PCT No.: PCT/CN2016/083061
§ 371 (c)(1),
(2) Date: Jun. 19, 2016

(87) PCT Pub. No.: WO2017/190378
PCT Pub. Date: Nov. 9, 2017

(30) Foreign Application Priority Data

May 3, 2016 (CN) .......................... 2016 1 0291073

(51) Int. Cl.
*H01L 51/00* (2006.01)
*H01L 51/56* (2006.01)
*H01L 51/50* (2006.01)
*H01L 27/32* (2006.01)

(52) U.S. Cl.
CPC .......... *H01L 51/56* (2013.01); *H01L 27/3241* (2013.01); *H01L 51/502* (2013.01); *H01L 51/508* (2013.01); *H01L 51/5064* (2013.01)

(58) Field of Classification Search
CPC ... H01L 51/56; H01L 51/502; H01L 51/5064; H01L 51/508; H01L 27/3241
USPC ............................................. 257/40
See application file for complete search history.

(56) References Cited

U.S. PATENT DOCUMENTS 9,656,908 B2 * 5/2017 Lee .............................. C09J 1/02

FOREIGN PATENT DOCUMENTS

| CN | 104910900 A | 9/2015 |
| CN | 105428546 A | 3/2016 |

* cited by examiner

*Primary Examiner* — Tu-Tu Ho
(74) *Attorney, Agent, or Firm* — Leong C. Lei

(57) ABSTRACT

The disclosure provides a manufacture method of a quantum dot light-emitting diode display and a quantum dot light-emitting diode display. The manufacture method of a quantum dot light-emitting diode display provided by the disclosure forms a light-emitting layer by a quantum dot thin film prepared by filming a metal complex solution, compared with a conventional ink jet printing method with quantum dot ink, process parameters can be adjusted easily, a process can be simple, costs can be reduced, three primary colors R, G, B can be adjusted by precisely controlling sub pixel levels, a color film can be omitted, which can be a better industrial design in weight and thickness. According to the quantum dot light-emitting diode display provided by the disclosure, the light-emitting layer is formed by a quantum dot thin film, which can offer the quantum dot light-emitting diode display excellent quality in display, the process is simple.

14 Claims, 6 Drawing Sheets

Step 1, providing a substrate, forming a plurality of anodes on the substrate separately; forming a pixel definition bank on the plurality of anodes and the substrate, a plurality of through-holes corresponding to the plurality of anodes respectively being defined in the pixel definition bank;

Step 2, forming a hole injection layer disposed above the anodes and a hole transport layer disposed above the hole injection layer in each of the through-holes in sequence;

Step 3, providing a metal complex solution, the metal complex solution being a solution prepared by dissolving a metal complex M-(XCH2COO-H3N+CH2CH2OH)2 in a non-polar solvent, wherein M comprises at least one of elements Cd and Zn, X comprises at least one of elements S or Se;

Step 4, dropping the metal complex solution on the hole transport layer in each of the through-holes, obtaining a quantum dot thin film after heating and drying, the quantum dot thin film forming a light-emitting layer;

Step 5, preparing an electron transport layer on the light-emitting layer in each of the through-holes, forming a cathode above the plurality of electron transport layers and the pixel definition bank in the plurality of through-holes.

Fig. 1

MANUFACTURE METHOD OF QUANTUM DOT LIGHT-EMITTING DIODE DISPLAY AND QUANTUM DOT LIGHT-EMITTING DIODE DISPLAY

FIELD OF THE DISCLOSURE

The disclosure relates to a display technical field, and more particularly to a manufacture method of a quantum dot light-emitting diode display and a quantum dot light-emitting diode display.

BACKGROUND OF THE DISCLOSURE

An organic light-emitting diode (OLED) display, also known as organic electroluminescent display, is a sort of newly developed flat panel display devices, which can be widely applied due to its simple manufacture process, low costs and energy consumption, high brightness, wide range of working temperature, lightweight and quick response, along with advantages such as easy realization of a color display and a large screen display, easy match with an integrated circuit driver, and a flexible display.

A carrier fluctuation goes considerable with a size of a semiconductor material turning from a bulk phase to a critical dimension (1 nm~20 nm), movement will be restricted, which leads to an increase in kinetic energy, a corresponding electronic structure turns from an energy level structure of a bulk phase continuity to a discontinuity of quasi fission, the phenomenon is called a quantum size effect. Common semiconductor nanoparticles, or quantum dots (DQs), mainly are elements in II-VI, III-V and IV-VI groups. The sorts of DQs all obey the quantum size effect, whose properties are changed with various sizes in order, such as absorption and emission waves alter with different sizes. Therefore, a semiconductor quantum dot is critical in fields such as lighting and display.

A quantum dot light-emitting material has advantages of focused spectrum and high color purity, in recent years, a light-emitting display employing a quantum dot material as a main part has been reported multiple times, efficiency of a quantum dot light-emitting diode (QLED) device with a quantum dot material as a light-emitting layer is 20% at present, which can be increased significantly with development in design of the device structure and the manufacture process, the QLED technique is regarded as a newer generation of display technique compared with the OLED display technique. At present, in a conventional process manufacturing a QLED device, a prepared high quality quantum dot material can be dissolved in a solvent to prepare a quantum dot thin film in a form of solution cast, as specific characteristics of a size and the surface property of a quantum dot material, methods of forming a film are regularly not ideal, which can reduce the efficiency of the device directly.

SUMMARY OF THE DISCLOSURE

An objective of the disclosure is to provide a manufacture method of a quantum dot light-emitting diode display, process parameters can be adjusted easily, a process can be simple, and costs can be reduced significantly as well.

Another objective of the disclosure is to provide a quantum dot light-emitting diode display with high display quality, whose process is simple and costs are low.

To achieve the objectives above, the disclosure provides a manufacture method of a quantum dot light-emitting diode display, including following steps:

step 1, providing a substrate, forming a plurality of anodes on the substrate separately; forming a pixel definition bank on the plurality of anodes and the substrate, a plurality of through-holes corresponding to the plurality of anodes respectively are defined in the pixel definition bank;

step 2, forming a hole injection layer disposed above the anodes and a hole transport layer disposed above the hole injection layer in each of the through-holes in sequence;

step 3, providing a metal complex solution, the metal complex solution is a solution prepared by dissolving a metal complex $M\text{-}(XCH_2COO^-H_3N^+CH_2CH_2OH)_2$ in a non-polar solvent, M includes at least one of elements Cd and Zn, X includes at least one of elements S or Se;

step 4, dropping the metal complex solution on the hole transport layer in each of the through-holes, obtaining a quantum dot thin film after heating and drying, the quantum dot thin film forms a light-emitting layer;

step 5, preparing an electron transport layer on the light-emitting layer in each of the through-holes, forming a cathode above the plurality of electron transport layers and the pixel definition bank in the plurality of through-holes.

In the step 3, a preparation method of the metal complex solution includes following steps:

step 31, dissolving thiohydracrylic acid or seleno-propionic acid, ethanolamine, a metal oxide or a metal hydroxide in 2-methoxyethanol, heating at 50° C.~65° C. till all solid substances dissolving thoroughly, achieving reaction liquor, a reaction equation:

$$HXCH_2COOH + H_2NCH_2CH_2OH + M(OH)_2/MO$$
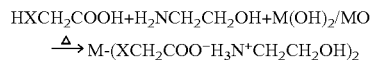
$$\xrightarrow{\Delta} M\text{-}(XCH_2COO^-H_3N^+CH_2CH_2OH)_2$$

M includes at least one of the elements Cd and Zn, X includes at least one of the elements S or Se;

step 32, centrifuging the achieved reaction liquor in the step 31, obtained precipitate is the metal complex $M\text{-}(XCH_2COO^-H_3N^+CH_2CH_2OH)_2$, dispersing the metal complex $M\text{-}(XCH_2COO^-H_3N^+CH_2CH_2OH)_2$ in a non-polar solvent again to achieve a metal complex solution.

In the step 31, metal oxide or metal hydroxide per mol corresponds to 1 mL~3 mL ethanolamine, 0.6 mL~1.8 mL thiohydracrylic acid or seleno-propionic acid, 1 mL~10 mL 2-methoxyethanol as a solvent, a volume ratio of ethanolamine and thiohydracrylic acid or seleno-propionic acid is 1:0.6; in the step 32, the non-polar solvent includes one or more of methylbenzene, trichloromethane and n-hexane.

In the step 1, a preparation method of the plurality of anodes is: depositing a conductive layer on the substrate, patterning the conductive layer by a photoetch process to form the plurality of anodes; a preparation method of the pixel definition bank is: coating an organic photoresist material on the substrate and the plurality of anodes to form a photoresist layer, exposing and developing the photoresist layer by a mask, forming the plurality of through-holes corresponding to the plurality of anodes above the plurality of anodes respectively, to obtain the pixel definition bank.

In the step 2, the hole injection layer, the hole transport layer are both prepared by ink jet printing; in the step 5, the electron transport layer is prepared by ink jet printing, the cathode is prepared by deposition.

The quantum dot thin film includes a red quantum dot thin film, a blue quantum dot thin film and a green quantum dot thin film; a range of the red quantum dot thin film luminescence spectra is 630 nm-690 nm, a range of the green quantum dot thin film luminescence spectra is 500 nm-560 nm, a range of the blue quantum dot thin film luminescence spectra is 420 nm-480 nm; in the step 4, temperatures for drying the red quantum dot thin film, the blue quantum dot thin film and the green quantum dot thin film are the same.

A material of the anodes is a transparent conductive metal oxide; a material of the pixel definition bank is an organic photoresist material; a material of the hole injection layer includes one or more of poly-phenylene vinylene compounds, polythiophene compounds, polysilane compounds, triphenylmethane compounds, triarylamine compounds, hydrazine compounds, pyrazoline compounds, oxazole compounds, carbazole compounds and butadiene compounds; a material of the hole transport layer is an organic material or an inorganic material; the organic material includes one or more of 4,4'-N,N'-dicarbazole-biphenyl, N,N'-Di[(1-naphthalenyl)-N,N'-diphenyl]-1,1'-biphenyl)-4,4'-diamine, 4,4',4''-Tris(N-azolyl)-triphenylamine and N,N'-Bis(4-(N,N'-diphenyl-amino)phenyl)-N,N'-diphenylbenzidine; the inorganic material includes one or more of NiO and $MoO_3$; a material of the electron transport layer is an organic material or an inorganic material; the inorganic material includes one or more of ZnO, $TiO_2$, $WO_3$ and $SnO_2$; the organic material includes one or two of 1,3,5-Tris(N-phenylbenzimidazol-2-yl)benzene and 3-(Biphenyl-4-yl)-5-(4-tert-butylphenyl)-4-phenyl-4H-1,2,4-triazole; a material of the cathode includes one or more of aluminum, silver and magnesium alloy.

The disclosure further provides a quantum dot light-emitting diode display, including a substrate, a plurality of anodes disposed on the substrate separately and a pixel definition bank disposed on the plurality of anodes and the substrate, a plurality of through-holes corresponding to the plurality of anodes respectively are defined in the pixel definition bank, a hole injection layer, a hole transport layer, a light-emitting layer and an electron transport layer are disposed in each of the through-holes from bottom to top in sequence, a cathode disposed above a plurality of electron transport layers and the pixel definition bank in the plurality of through-holes are included as well; the light-emitting layer is a quantum dot thin film formed by filming a metal complex solution, the metal complex solution is a solution prepared by dissolving a metal complex M-$(XCH_2COO^-H_3N^+CH_2CH_2OH)_2$ in a non-polar solvent, M includes at least one of elements Cd and Zn, X includes at least one of elements S or Se.

The quantum dot thin film includes a red quantum dot thin film, a blue quantum dot thin film and a green quantum dot thin film; a range of the red quantum dot thin film luminescence spectra is 630 nm-690 nm, a range of the green quantum dot thin film luminescence spectra is 500 nm-560 nm, a range of the blue quantum dot thin film luminescence spectra is 420 nm-480 nm.

The non-polar solvent includes one or more of methylbenzene, trichloromethane and n-hexane.

A material of the anodes is a transparent conductive metal oxide; a material of the pixel definition bank is an organic photoresist material; a material of the hole injection layer includes one or more of poly-phenylene vinylene compounds, polythiophene compounds, polysilane compounds, triphenylmethane compounds, triarylamine compounds, hydrazine compounds, pyrazoline compounds, oxazole compounds, carbazole compounds and butadiene compounds; a material of the hole transport layer is an organic material or an inorganic material; the organic material includes one or more of 4,4'-N,N'-dicarbazole-biphenyl, N,N'-Di[(1-naphthalenyl)-N,N'-diphenyl]-1,1'-biphenyl)-4,4'-diamine, 4,4',4''-Tris(N-azolyl)-triphenylamine and N,N'-Bis(4-(N,N'-diphenyl-amino)phenyl)-N,N'-diphenylbenzidine; the inorganic material includes one or more of NiO and $MoO_3$; a material of the electron transport layer is an organic material or an inorganic material; the inorganic material includes one or more of ZnO, $TiO_2$, $WO_3$ and $SnO_2$; the organic material includes one or two of 1,3,5-Tris(N-phenylbenzimidazol-2-yl)benzene and 3-(Biphenyl-4-yl)-5-(4-tert-butylphenyl)-4-phenyl-4H-1,2,4-triazole; a material of the cathode includes one or more of aluminum, silver and magnesium alloy.

The disclosure further provides a manufacture method of a quantum dot light-emitting diode display, including following steps:

step 1, providing a substrate, forming a plurality of anodes on the substrate separately; forming a pixel definition bank on the plurality of anodes and the substrate, a plurality of through-holes corresponding to the plurality of anodes respectively are defined in the pixel definition bank;

step 2, forming a hole injection layer disposed above the anodes and a hole transport layer disposed above the hole injection layer in each of the through-holes in sequence;

step 3, providing a metal complex solution, the metal complex solution is a solution prepared by dissolving a metal complex M-$(XCH_2COO^-H_3N^+CH_2CH_2OH)_2$ in a non-polar solvent, M includes at least one of elements Cd and Zn, X includes at least one of elements S or Se;

step 4, dropping the metal complex solution on the hole transport layer in each of the through-holes, obtaining a quantum dot thin film after heating and drying, the quantum dot thin film forms a light-emitting layer;

step 5, preparing an electron transport layer on the light-emitting layer in each of the through-holes, forming a cathode above the plurality of electron transport layers and the pixel definition bank in the plurality of through-holes;

in the step 3, a preparation method of the metal complex solution includes following steps:

step 31, dissolving thiohydracrylic acid or seleno-propionic acid, ethanolamine, a metal oxide or a metal hydroxide in 2-methoxyethanol, heating at 50° C.~65° C. till all solid substances dissolving thoroughly, achieving reaction liquor, a reaction equation:

$HXCH_2COOH+H_2NCH_2CH_2OH+M(OH)_2/MO$
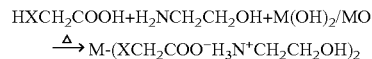
$\xrightarrow{\Delta} M\text{-}(XCH_2COO^-H_3N^+CH_2CH_2OH)_2$ M includes at least one of the elements Cd and Zn, X includes at least one of the elements S or Se;

step 32, centrifuging the achieved reaction liquor in the step 31, obtained precipitate is the metal complex M-$(XCH_2COO^-H_3N^+CH_2CH_2OH)_2$, dispersing the metal complex M-$(XCH_2COO^-H_3N^+CH_2CH_2OH)_2$ in a non-polar solvent again to achieve a metal complex solution;

in the step 1, a preparation method of the plurality of anodes is: depositing a conductive layer on the substrate, patterning the conductive layer by a photoetch process to form the plurality of anodes; a preparation method of the pixel definition bank is: coating an organic photoresist material on the substrate and the plurality of anodes to form a photoresist layer, exposing and developing the photoresist layer by a mask, forming the plurality of through-holes corresponding to in the plurality of anodes above the plurality of anodes respectively, to obtain the pixel definition bank; in the step 2, the hole injection layer, the hole transport layer are prepared by ink jet printing; in the step 5, the electron transport layer is prepared by ink jet printing, the cathode is prepared by deposition.

Advantages of the disclosure: the manufacture method of a quantum dot light-emitting diode display provided by the disclosure forms a light-emitting layer by a quantum dot thin film prepared by filming a metal complex solution, compared with a conventional ink jet printing method with quantum dot ink, process parameters can be adjusted easily, a process can be simple, costs can be reduced, three primary colors R, G, B can be adjusted by precisely controlling sub pixel levels, a color film can be omitted, which can be a better industrial design in weight and thickness. According to the quantum dot light-emitting diode display provided by the disclosure, the light-emitting layer is formed by a quantum dot thin film, which can offer the quantum dot light-emitting diode display excellent quality in display, the process is simple and the costs are low.

In order to more clearly illustrate properties and techniques of the disclosure, following embodiments and figures of the disclosure can be referred, it is obvious that the drawings are merely for illustrating the embodiments, which should not be treated as a limitation.

BRIEF DESCRIPTION OF THE DRAWINGS

Embodiments of the disclosure are described in detail with reference to the accompanying drawings as follows to better understand the technical proposal and other advantages of the disclosure.

In figures,

FIG. 1 is a flow chart of a manufacture method of a quantum dot light-emitting diode display of the disclosure.

DETAILED DESCRIPTION OF PREFERRED EMBODIMENTS

Preferred embodiments and the accompanying drawings are described in detail to better illustrate the technical proposal and the corresponding effects.

Referring to FIG. 1, the disclosure first provides a manufacture method of a quantum dot light-emitting diode display, including following steps:

step 1, as shown in FIGS. 2-5, providing a substrate 10, forming a plurality of anodes 20 on the substrate 10 separately; forming a pixel definition bank 30 on the plurality of anodes 20 and the substrate 10, a plurality of through-holes 31 corresponding to the plurality of anodes 20 respectively are defined in the pixel definition bank 30.

Figure 2:
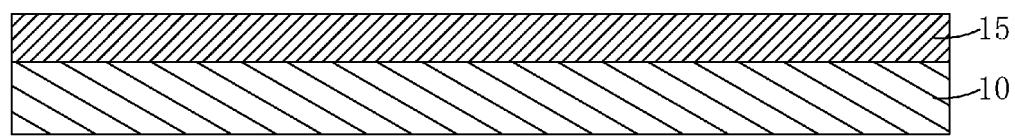
FIG. 2 through FIG. 5 are schematic views of step 1 of the manufacture method of a quantum dot light-emitting diode display of the disclosure.
Figure 3:
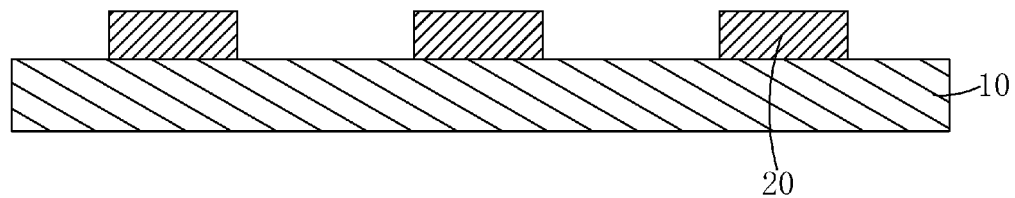

Specifically, a preparation method of the plurality of anodes 20 is: as shown in FIGS. 2-3, depositing a conductive layer 15 on the substrate 10, patterning the conductive layer 15 by a photoetch process to form the plurality of anodes 20.

Specifically, the substrate 10 is a transparent substrate, a glass substrate is preferred.

Specifically, a material of the anodes 20 is a transparent conductive metal oxide, indium tin oxide (ITO) is a preference.

Figure 4:
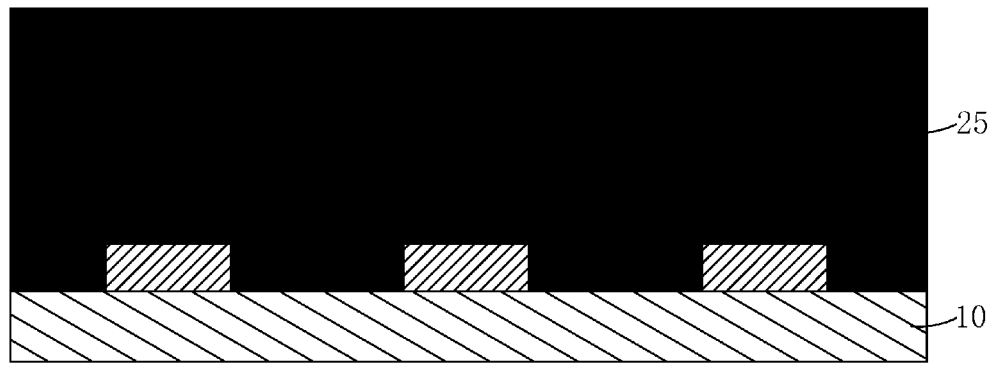
Figure 5:
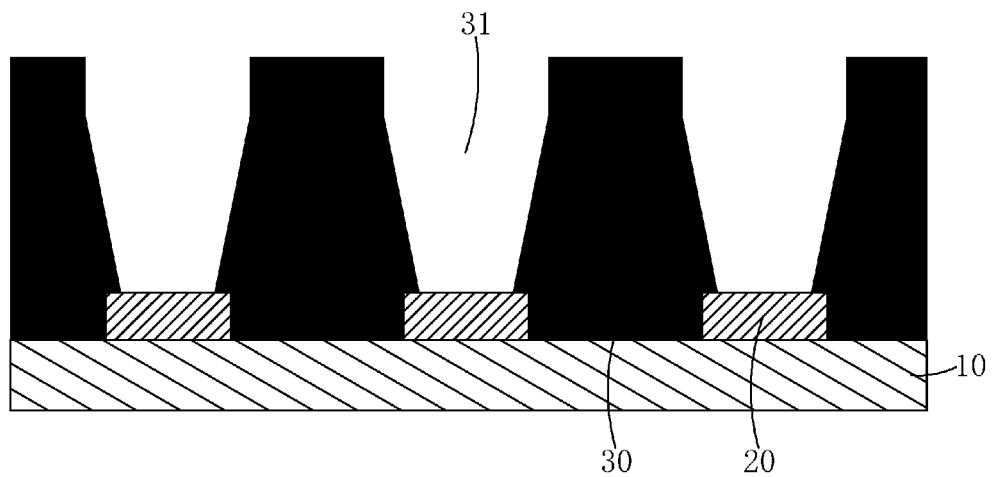

Specifically, a preparation method of the pixel definition bank 30: as shown in FIGS. 4-5, coating an organic photoresist material on the substrate 10 and the plurality of anodes 20 to form a photoresist layer 25, patterning the photoresist layer 25 by a mask, forming the plurality of through-holes 31 corresponding to the plurality of anodes 20 above the plurality of anodes 20 respectively, to obtain the pixel definition bank 30.

Preferably, a material of the pixel definition bank 30 is a black organic photoresist material.

Figure 6:
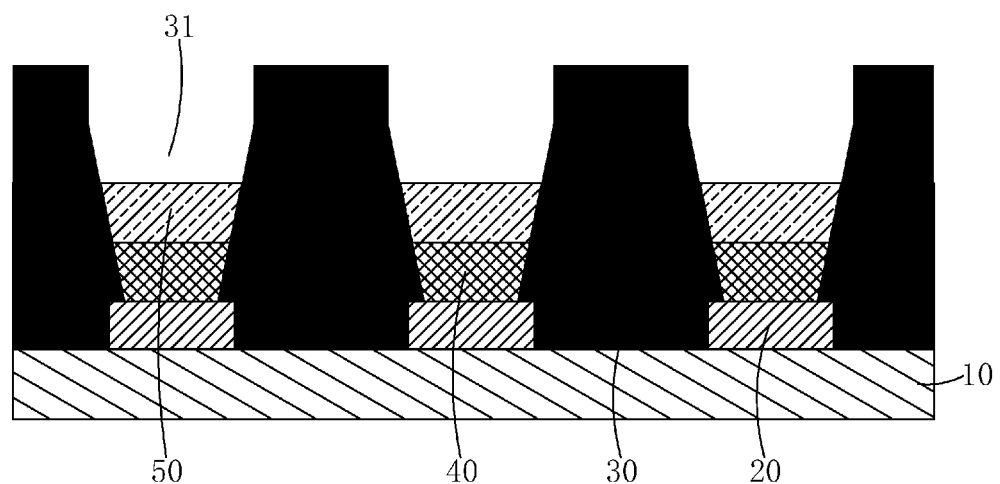
FIG. 6 is a schematic view of step 2 of the manufacture method of a quantum dot light-emitting diode display of the disclosure.

Step 2, as shown in FIG. 6, forming a hole injection layer (HIL) 40 disposed above the anodes 20 and a hole transport layer (HTL) 50 disposed above the hole injection layer 40 in each of the through-holes 31 in sequence.

Specifically, a material of the hole injection layer 40 includes one or more of poly-phenylene vinylene (PPV) compounds, polythiophene compounds, polysilane compounds, triphenylmethane compounds, triarylamine compounds, hydrazine compounds, pyrazoline compounds, oxazole compounds, carbazole compounds and butadiene compounds.

Specifically, a material of the hole transport layer 50 is an organic material or an inorganic material; the organic material includes one or more of 4,4'-N,N'-dicarbazole-biphenyl (CBP), N,N'-Di[(1-naphthalenyl)-N,N'-diphenyl]-1,1'-biphenyl)-4,4'-diamine (a-NPD), 4,4',4''-Tris(N-azolyl)-triphenylamine (TCCA) and N,N'-Bis(4-(N,N'-diphenyl-amino) phenyl)-N,N'-diphenylbenzidine (DNTPD); the inorganic material includes one or more of NiO and $MoO_3$.

Specifically, the hole injection layer 40, the hole transport layer 50 are both prepared by ink jet printer (IJP).

Step 3, providing a metal complex solution, the metal complex solution is a solution prepared by dissolving a metal complex $M\text{-}(XCH_2COO^-H_3N^+CH_2CH_2OH)_2$ in a non-polar solvent, M includes at least one of elements Cd and Zn, X includes at least one of elements S or Se.

Specifically, a preparation method of the metal complex solution includes following steps:

step 31, dissolving thiohydracrylic acid ($HSCH_2COOH$) or seleno-propionic acid ($HSeCH_2COOH$), ethanolamine ($H_2NCH_2CH_2OH$), a metal oxide (MO) or a metal hydroxide ($M(OH)_2$) in 2-methoxyethanol, heating at 50° C.~65° C. till all solid substances dissolving thoroughly, achieving reaction liquor, a reaction equation:

$$HXCH_2COOH+H_2NCH_2CH_2OH+M(OH)_2/MO \xrightarrow{\Delta} M\text{-}(XCH_2COO^-H_3N^+CH_2CH_2OH)_2$$

In the previous reaction equation, M includes at least one of the elements Cd and Zn, X includes at least one of the elements S or Se.

In the step 31, metal oxide or metal hydroxide per mol corresponds to 1 mL~3 mL ethanolamine, 0.6 mL~1.8 mL thiohydracrylic acid or seleno-propionic acid, 1 mL~10 mL 2-methoxyethanol as a solvent, a volume ratio of ethanolamine and thiohydracrylic acid or seleno-propionic acid is 1:0.6.

For instance, when the product is a CdS quantum dot thin film, a preparation method of the step 31 is: adding 1.2 mL thiohydracrylic acid, 2 mL ethanolamine, 2 mol cadmium hydroxide (0.293 g) and 4 mL 2-methoxyethanol in a three-necked flask, under protection of nitrogen, heating at 65° C. till all solid substances dissolving thoroughly, achieving reaction liquor.

Step 32, centrifuging the achieved reaction liquor in the step 31, obtained precipitate is the metal complex $M\text{-}(XCH_2COO^-H_3N^+CH_2CH_2OH)_2$, dispersing the metal complex M-(XCH$_2$COO$^-$H$_3$N$^+$CH$_2$CH$_2$OH)$_2$ in a non-polar solvent again to achieve a metal complex solution.

Specifically, the non-polar solvent includes one or more of methylbenzene, trichloromethane and n-hexane.

Figure 7:
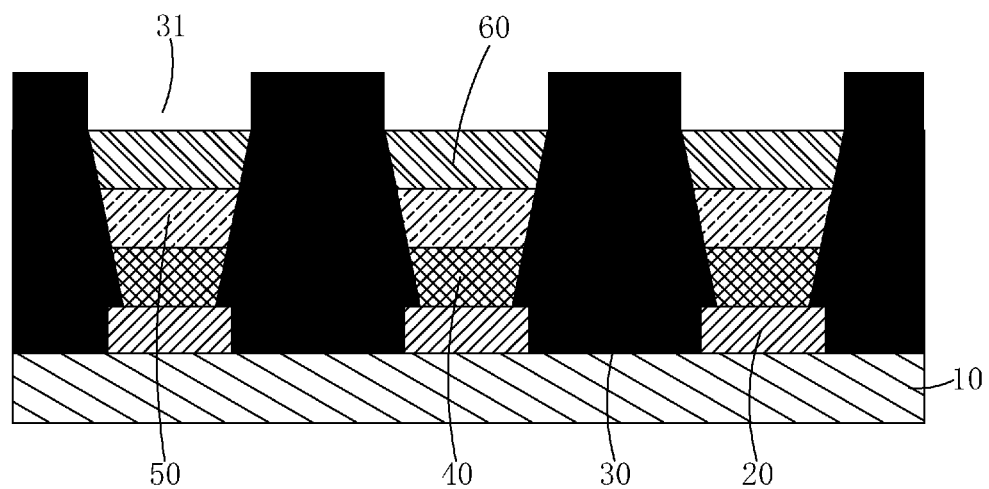
FIG. 7 is a schematic view of step 4 of the manufacture method of a quantum dot light-emitting diode display of the disclosure.

Step 4, as shown in FIG. 7, dropping the metal complex solution on the hole transport layer 50 in each of the through-holes 31, obtaining a quantum dot thin film after heating and drying, the quantum dot thin film forms a light-emitting layer (EL) 60.

Specifically, the quantum dot thin film includes a red quantum dot thin film, a blue quantum dot thin film and a green quantum dot thin film. A range of the quantum dot thin film luminescence spectra is achieved by adjusting a material or a ratio of the metal complex solution. A range of the red quantum dot thin film luminescence spectra is 630 nm-690 nm, a range of the green quantum dot thin film luminescence spectra is 500 nm-560 nm, a range of the blue quantum dot thin film luminescence spectra is 420 nm-480 nm.

Specifically, in the step 4, the temperature of heating and drying the metal complex solution is 180° C.~250° C., 220° C.~240° C. will be better, 230° C. is the best choice.

Specifically, in the step 4, temperatures for drying the red quantum dot thin film, the blue quantum dot thin film and the green quantum dot thin film are the same, which make it better than a conventional manufacture method of an OLED device, as a difference in solvent coefficients of R, G, B organic luminous ink applied within an ink jet printer, other parameters like a temperature of evaporating solvent can be various, which needs to adjust parameters such as the temperature repeatedly, but the technical proposal provided by the disclosure can film the R, G, B quantum dot thin films at the same temperature by adjusting a material or a ratio of the metal complex solution, the process can be simplified.

Figure 8:
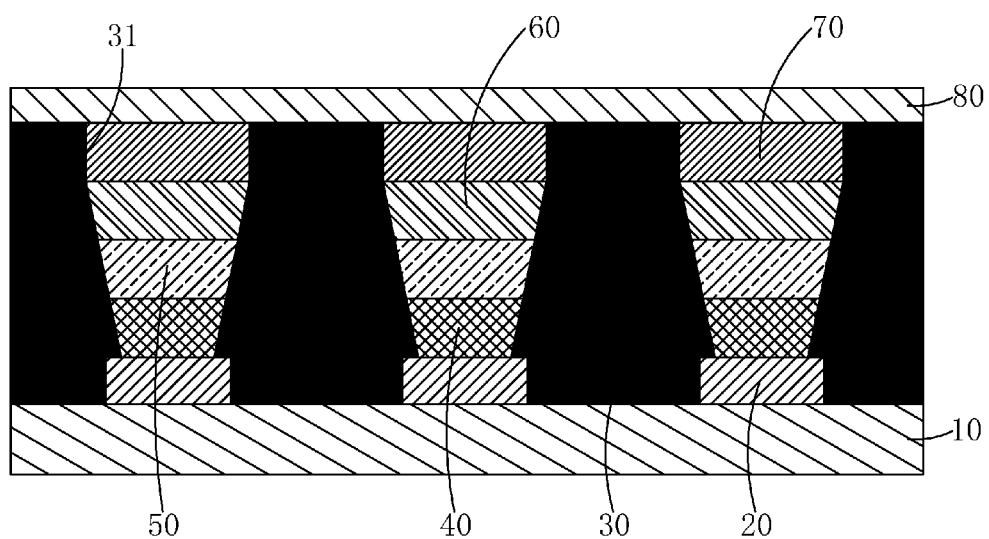
FIG. 8 is a schematic view of step 5 of the manufacture method of a quantum dot light-emitting diode display of the disclosure and a structural view of a quantum dot light-emitting diode display of the disclosure.

Step 5, as shown in FIG. 8, preparing an electron transport layer (ETL) 70 on the light-emitting layer 60 in each of the through-holes 31, forming a cathode 80 above the plurality of electron transport layers 70 and the pixel definition bank 30 in the plurality of through-holes 31.

At this point, a manufacture process of a quantum dot light-emitting diode display is completed.

Specifically, the electron transport layer 70 is prepared by ink jet printing; the cathode 80 is prepared by deposition.

Specifically, a material of the electron transport layer 70 is an organic material or an inorganic material; the inorganic material includes one or more of ZnO, TiO$_2$, WO$_3$ and SnO$_2$; the organic material includes one or two of 1,3,5-Tris(N-phenylbenzimidazol-2-yl)benzene (TPBI) and 3-(Biphenyl-4-yl)-5-(4-tert-butylphenyl)-4-phenyl-4H-1,2,4-triazole (TAZ).

Specifically, a material of the cathode 80 includes one or more of aluminum (Al), silver (Ag) and magnesium silver (MgAg) alloy.

Referring to FIG. 8, based on the manufacture method of a quantum dot light-emitting diode display above, the disclosure further provides a quantum dot light-emitting diode display, including the substrate 10, the plurality of anodes 20 disposed on the substrate 10 separately and the pixel definition bank 30 disposed on the plurality of anodes 20 and the substrate 10, the plurality of through-holes 31 corresponding to the plurality of anodes 20 respectively are defined in the pixel definition bank 30, the hole injection layer 40, the hole transport layer 50, the light-emitting layer 60 and the electron transport layer 70 are disposed in each of the through-holes 31 from bottom to top in sequence; the cathode 80 disposed above a plurality of electron transport layers 70 and the pixel definition bank 30 in the plurality of through-holes 31 are included as well; the light-emitting layer 60 is a quantum dot thin film formed by filming a metal complex solution, the metal complex solution is a solution prepared by dissolving a metal complex M-(XCH$_2$COO$^-$H$_3$N$^+$CH$_2$CH$_2$OH)$_2$ in a non-polar solvent, M includes at least one of elements Cd and Zn, X includes at least one of elements S or Se.

Specifically, the quantum dot thin film includes a red quantum dot thin film, a blue quantum dot thin film and a green quantum dot thin film. A range of the quantum dot thin film luminescence spectra is achieved by adjusting a material or a ratio of the metal complex solution. A range of the red quantum dot thin film luminescence spectra is 630 nm-690 nm, a range of the green quantum dot thin film luminescence spectra is 500 nm-560 nm, a range of the blue quantum dot thin film luminescence spectra is 420 nm-480 nm.

Specifically, the non-polar solvent includes one or more of methylbenzene, trichloromethane and n-hexane.

Specifically, the substrate 10 is a transparent substrate, a glass substrate is preferred.

Specifically, a material of the anodes 20 is a transparent conductive metal oxide, indium tin oxide is a preference.

Specifically, a material of the pixel definition bank 30 is an organic photoresist material, a black organic photoresist material is preferable.

Specifically, a material of the hole injection layer 40 includes one or more of poly-phenylene vinylene compounds, polythiophene compounds, polysilane compounds, triphenylmethane compounds, triarylamine compounds, hydrazine compounds, pyrazoline compounds, oxazole compounds, carbazole compounds and butadiene compounds.

Specifically, a material of the hole transport layer 50 is an organic material or an inorganic material; the organic material includes one or more of 4,4'-N,N'-dicarbazole-biphenyl, N,N'-Di[(1-naphthalenyl)-N,N'-diphenyl]-1,1'-biphenyl)-4, 4'-diamine, 4,4',4"-Tris(N-azolyl)-triphenylamine and N,N'-Bis(4-(N,N'-diphenyl-amino)phenyl)-N,N'-diphenylbenzidine; the inorganic material includes one or more of NiO and MoO$_3$.

Specifically, a material of the electron transport layer 70 is an organic material or an inorganic material; the inorganic material includes one or more of ZnO, TiO$_2$, WO$_3$ and SnO$_2$; the organic material includes one or more of 1,3,5-Tris(N-phenylbenzimidazol-2-yl)benzene and 3-(Biphenyl-4-yl)-5-(4-tert-butylphenyl)-4-phenyl-4H-1,2,4-triazole.

Specifically, a material of the cathode 80 includes one or more of aluminum, silver and magnesium silver alloy.

Specifically, the hole injection layer 40, the hole transport layer 50, the light-emitting layer 60, the electron transport layer 70 are prepared by ink jet printing, the cathode 80 is prepared by deposition.

Overall, the manufacture method of a quantum dot light-emitting diode display provided by the disclosure forms a light-emitting layer by a quantum dot thin film prepared by filming a metal complex solution, compared with a conventional ink jet printing method with quantum dot ink, process parameters can be adjusted easily, a process can be simple, costs can be reduced, an adjustment of three primary colors R, G, B can be controlled by precisely controlling sub pixel levels, a color film can be omitted, which can be a better industrial design in weight and thickness. According to the quantum dot light-emitting diode display provided by the disclosure, the light-emitting layer is formed by a quantum dot thin film, which can offer the quantum dot light-emitting diode display excellent quality in display, the process is simple and the costs are low.

It is understandable in practical to a person skilled in the art, the aforesaid embodiment can be accomplished with modifications, equivalent replacements or improvements within the spirit and principles of the embodiment described above, which should be covered by the protected scope of the disclosure.

What is claimed is:

1. A manufacture method of a quantum dot light-emitting diode display, comprising following steps:
step 1, providing a substrate, forming a plurality of anodes on the substrate separately; forming a pixel definition bank on the plurality of anodes and the substrate, a plurality of through-holes corresponding to the plurality of anodes respectively being defined in the pixel definition bank;
step 2, forming a hole injection layer disposed above the anodes and a hole transport layer disposed above the hole injection layer in each of the through-holes in sequence;
step 3, providing a metal complex solution, the metal complex solution being a solution prepared by dissolving a metal complex M-(XCH$_2$COO$^-$H$_3$N$^+$CH$_2$CH$_2$OH)$_2$ in a non-polar solvent, wherein M comprises at least one of elements Cd and Zn, X comprises at least one of elements S or Se;
step 4, dropping the metal complex solution on the hole transport layer in each of the through-holes, obtaining a quantum dot thin film after heating and drying, the quantum dot thin film forming a light-emitting layer;
step 5, preparing an electron transport layer on the light-emitting layer in each of the through-holes, forming a cathode above the plurality of electron transport layers and the pixel definition bank in the plurality of through-holes.

2. The manufacture method of a quantum dot light-emitting diode display according to claim 1, wherein in the step 3, a preparation method of the metal complex solution comprises following steps:
step 31, dissolving thiohydracrylic acid or seleno-propionic acid, ethanolamine, a metal oxide or a metal hydroxide in 2-methoxyethanol, heating at 50° C.~65° C. till all solid substances dissolving thoroughly, achieving reaction liquor, a reaction equation:

HXCH$_2$COOH+H$_2$NCH$_2$CH$_2$OH+M(OH)$_2$/MO
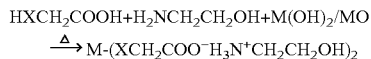
M-(XCH$_2$COO$^-$H$_3$N$^+$CH$_2$CH$_2$OH)$_2$ wherein M comprises at least one of the elements Cd and Zn, X comprises at least one of the elements S or Se;
step 32, centrifuging the achieved reaction liquor in the step 31, obtained precipitate being the metal complex M-(XCH$_2$COO$^-$H$_3$N$^+$CH$_2$CH$_2$OH)$_2$, dispersing the metal complex M-(XCH$_2$COO$^-$H$_3$N$^+$CH$_2$CH$_2$OH)$_2$ in a non-polar solvent again to achieve a metal complex solution.

3. The manufacture method of a quantum dot light-emitting diode display according to claim 2, wherein in the step 31, metal oxide or metal hydroxide per mol corresponding to 1 mL~3 mL ethanolamine, 0.6 mL~1.8 mL thiohydracrylic acid or seleno-propionic acid, 1 mL~10 mL 2-methoxyethanol as a solvent, wherein a volume ratio of ethanolamine and thiohydracrylic acid or seleno-propionic acid is 1:0.6;
in the step 32, the non-polar solvent comprising one or more of methylbenzene, trichloromethane and n-hexane.

4. The manufacture method of a quantum dot light-emitting diode display according to claim 1, wherein in the step 1, a preparation method of the plurality of anodes is: depositing a conductive layer on the substrate, patterning the conductive layer by a photoetch process to form the plurality of anodes;
a preparation method of the pixel definition bank: coating an organic photoresist material on the substrate and the plurality of anodes to form a photoresist layer, exposing and developing the photoresist layer by a mask, forming the plurality of through-holes corresponding to the plurality of anodes above the plurality of anodes respectively, to obtain the pixel definition bank;
in the step 2, the hole injection layer, the hole transport layer being prepared by ink jet printing;
in the step 5, the electron transport layer being prepared by ink jet printing, the cathode being prepared by deposition.

5. The manufacture method of a quantum dot light-emitting diode display according to claim 1, wherein the quantum dot thin film comprises a red quantum dot thin film, a blue quantum dot thin film and a green quantum dot thin film; a range of the red quantum dot thin film luminescence spectra is 630 nm-690 nm, a range of the green quantum dot thin film luminescence spectra is 500 nm-560 nm, a range of the blue quantum dot thin film luminescence spectra is 420 nm-480 nm;
in the step 4, temperatures for drying the red quantum dot thin film, the blue quantum dot thin film and the green quantum dot thin film being the same.

6. The manufacture method of a quantum dot light-emitting diode display according to claim 1, wherein a material of the anodes is a transparent conductive metal oxide;
a material of the pixel definition bank being an organic photoresist material;
a material of the hole injection layer comprising one or more of poly-phenylene vinylene compounds, polythiophene compounds, polysilane compounds, triphenylmethane compounds, triarylamine compounds, hydrazine compounds, pyrazoline compounds, oxazole compounds, carbazole compounds and butadiene compounds;
a material of the hole transport layer being an organic material or an inorganic material; the organic material comprising one or more of 4,4'-N,N'-dicarbazole-biphenyl, N,N'-Di[(1-naphthalenyl)-N,N'-diphenyl]-1,1'-biphenyl)-4,4'-diamine, 4,4',4"-Tris(N-azolyl)-triphenylamine and N,N'-Bis(4-(N,N'-diphenyl-amino)phenyl)-N,N'-diphenylbenzidine; the inorganic material comprising one or more of NiO and MoO$_3$;
a material of the electron transport layer being an organic material or an inorganic material; the inorganic material comprising one or more of ZnO, TiO$_2$, WO$_3$ and SnO$_2$; the organic material comprising one or two of 1,3,5-Tris(N-phenylbenzimidazol-2-yl)benzene and 3-(Biphenyl-4-yl)-5-(4-tert-butylphenyl)-4-phenyl-4H-1,2,4-triazole;
a material of the cathode comprising one or more of aluminum, silver and magnesium silver alloy.

7. A quantum dot light-emitting diode display, comprising a substrate, a plurality of anodes disposed on the substrate separately and a pixel definition bank disposed on the plurality of anodes and the substrate, a plurality of through-holes corresponding to the plurality of anodes respectively being defined in the pixel definition bank, a hole injection layer, a hole transport layer, a light-emitting layer and an electron transport layer being disposed in each of the through-holes from bottom to top in sequence; a cathode disposed above a plurality of electron transport layers and the pixel definition bank in the plurality of through-holes being comprised as well;

the light-emitting layer being a quantum dot thin film formed by filming a metal complex solution, the metal complex solution being a solution prepared by dissolving a metal complex $M\text{-}(XCH_2COO^-H_3N^+CH_2CH_2OH)_2$ in a non-polar solvent, wherein M comprises at least one of elements Cd and Zn, X comprises at least one of elements S or Se.

8. The quantum dot light-emitting diode display according to claim 7, wherein the quantum dot thin film comprises a red quantum dot thin film, a blue quantum dot thin film and a green quantum dot thin film; a range of the red quantum dot thin film luminescence spectra is 630 nm-690 nm, a range of the green quantum dot thin film luminescence spectra is 500 nm-560 nm, a range of the blue quantum dot thin film luminescence spectra is 420 nm-480 nm.

9. The quantum dot light-emitting diode display according to claim 7, wherein the non-polar solvent comprising one or more of methylbenzene, trichloromethane and n-hexane.

10. The quantum dot light-emitting diode display according to claim 7, wherein a material of the anodes is a transparent conductive metal oxide;

a material of the pixel definition bank is an organic photoresist material;

a material of the hole injection layer comprises one or more of poly-phenylene vinylene compounds, polythiophene compounds, polysilane compounds, triphenylmethane compounds, triarylamine compounds, hydrazine compounds, pyrazoline compounds, oxazole compounds, carbazole compounds and butadiene compounds;

a material of the hole transport layer is an organic material or an inorganic material; the organic material comprises one or more of 4,4'-N,N'-dicarbazole-biphenyl, N,N'-Di[(1-naphthalenyl)-N,N'-diphenyl]-1,1'-biphenyl)-4,4'-diamine, 4,4',4''-Tris(N-azolyl)-triphenylamine and N,N'-Bis(4-(N,N'-diphenyl-amino)phenyl)-N,N'-diphenylbenzidine; the inorganic material comprises one or more of NiO and $MoO_3$;

a material of the electron transport layer is an organic material or an inorganic material; the inorganic material comprises one or more of ZnO, $TiO_2$, $WO_3$ and $SnO_2$; the organic material comprises one or more of 1,3,5-Tris(N-phenylbenzimidazol-2-yl)benzene and 3-(Biphenyl-4-yl)-5-(4-tert-butylphenyl)-4-phenyl-4H-1,2,4-triazole;

a material of the cathode comprises one or more of aluminum, silver and magnesium silver alloy.

11. A manufacture method of a quantum dot light-emitting diode display, comprising following steps:

step 1, providing a substrate, forming a plurality of anodes on the substrate separately; forming a pixel definition bank on the plurality of anodes and the substrate, a plurality of through-holes corresponding to the plurality of anodes respectively being defined in the pixel definition bank;

step 2, forming a hole injection layer disposed above the anodes and a hole transport layer disposed above the hole injection layer in each of the through-holes in sequence;

step 3, providing a metal complex solution, the metal complex solution being a solution prepared by dissolving a metal complex $M\text{-}(XCH_2COO^-H_3N^+CH_2CH_2OH)_2$ in a non-polar solvent, wherein M comprises at least one of elements Cd and Zn, X comprises at least one of elements S or Se;

step 4, dropping the metal complex solution on the hole transport layer in each of the through-holes, obtaining a quantum dot thin film after heating and drying, the quantum dot thin film forming a light-emitting layer;

step 5, preparing an electron transport layer on the light-emitting layer in each of the through-holes, forming a cathode above the plurality of electron transport layers and the pixel definition bank in the plurality of through-holes;

wherein in the step 3, a preparation method of the metal complex solution comprises following steps:

step 31, dissolving thiohydracrylic acid or seleno-propionic acid, ethanolamine, a metal oxide or a metal hydroxide in 2-methoxyethanol, heating at 50° C.~65° C. till all solid substances dissolving thoroughly, achieving reaction liquor, a reaction equation:

$HXCH_2COOH + H_2NCH_2CH_2OH + M(OH)_2/MO$
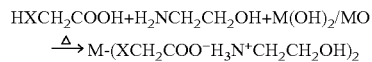

wherein M comprises at least one of the elements Cd and Zn, X comprises at least one of the elements S or Se;

step 32, centrifuging the achieved reaction liquor in the step 31, obtained precipitate being the metal complex $M\text{-}(XCH_2COO^-H_3N^+CH_2CH_2OH)_2$, dispersing the metal complex $M\text{-}(XCH_2COO^-H_3N^+CH_2CH_2OH)_2$ in a non-polar solvent again to achieve a metal complex solution;

wherein in the step 1, a preparation method of the plurality of anodes is: depositing a conductive layer on the substrate, patterning the conductive layer by a photoetch process to form the plurality of anodes;

a preparation method of the pixel definition bank: coating an organic photoresist material on the substrate and the plurality of anodes to form a photoresist layer, exposing and developing the photoresist layer by a mask, forming the plurality of through-holes corresponding to the plurality of anodes above the plurality of anodes respectively, to obtain the pixel definition bank;

in the step 2, the hole injection layer, the hole transport layer being prepared by ink jet printing;

in the step 5, the electron transport layer being prepared by ink jet printing, the cathode being prepared by deposition.

12. The manufacture method of a quantum dot light-emitting diode display according to claim 11, wherein in the step 31, metal oxide or metal hydroxide per mol corresponding to 1 mL~3 mL ethanolamine, 0.6 mL~1.8 mL thiohydracrylic acid or seleno-propionic acid, 1 mL~10 mL 2-methoxyethanol as a solvent, wherein a volume ratio of ethanolamine and thiohydracrylic acid or seleno-propionic acid is 1:0.6;

in the step 32, the non-polar solvent comprising one or more of methylbenzene, trichloromethane and n-hexane.

13. The manufacture method of a quantum dot light-emitting diode display according to claim 11, wherein the quantum dot thin film comprises a red quantum dot thin film, a blue quantum dot thin film and a green quantum dot thin film; a range of the red quantum dot thin film luminescence spectra is 630 nm-690 nm, a range of the green quantum dot thin film luminescence spectra is 500 nm-560 nm, a range of the blue quantum dot thin film luminescence spectra is 420 nm-480 nm;

in the step 4, temperatures for drying the red quantum dot thin film, the blue quantum dot thin film and the green quantum dot thin film being the same.

14. The manufacture method of a quantum dot light-emitting diode display according to claim 11, wherein a material of the anodes is a transparent conductive metal oxide;

a material of the pixel definition bank being an organic photoresist material;

a material of the hole injection layer comprising one or more of poly-phenylene vinylene compounds, polythiophene compounds, polysilane compounds, triphenylmethane compounds, triarylamine compounds, hydrazine compounds, pyrazoline compounds, oxazole compounds, carbazole compounds and butadiene compounds;

a material of the hole transport layer being an organic material or an inorganic material; the organic material comprising one or more of 4,4'-N,N'-dicarbazole-biphenyl, N,N'-Di[(1-naphthalenyl)-N,N'-diphenyl]-1,1'-biphenyl)-4,4'-diamine, 4,4',4"-Tris(N-azolyl)-triphenylamine and N,N'-Bis(4-(N,N'-diphenyl-amino)phenyl)-N,N'-diphenylbenzidine; the inorganic material comprising one or more of NiO and $MoO_3$;

a material of the electron transport layer being an organic material or an inorganic material; the inorganic material comprising one or more of ZnO, $TiO_2$, $WO_3$ and $SnO_2$; the organic material comprising one or two of 1,3,5-Tris(N-phenylbenzimidazol-2-yl)benzene and 3-(Biphenyl-4-yl)-5-(4-tert-butylphenyl)-4-phenyl-4H-1,2,4-triazole;

a material of the cathode comprising one or more of aluminum, silver and magnesium silver alloy.

* * * * *